United States Patent [19]
Bello et al.

[11] Patent Number: 5,968,849
[45] Date of Patent: Oct. 19, 1999

[54] METHOD FOR PRE-SHAPING A SEMICONDUCTOR SUBSTRATE FOR POLISHING AND STRUCTURE

[75] Inventors: Fernando A. Bello, Scottsdale; James B. Hall, Chandler; Earl W. O'Neal, Scottsdale; James S. Parsons, Scottsdale; Cindy Welt, Scottsdale; George W. Bailey, Gilbert, all of Ariz.

[73] Assignee: Motorola, Inc., Schaumburg, Ill.

[21] Appl. No.: 08/512,050

[22] Filed: Aug. 7, 1995

Related U.S. Application Data

[63] Continuation-in-part of application No. 08/494,510, Jun. 26, 1995, abandoned.

[51] Int. Cl.⁶ .................................................. H01L 21/302
[52] U.S. Cl. ...................... 438/747; 438/753; 438/974; 216/38; 216/83; 216/91; 216/99
[58] Field of Search .................... 156/637, 639, 156/636, 645; 216/52, 53, 58, 83, 90, 91, 96, 38, 99; 437/228, 249; 438/692, 747, 753, 974

[56] References Cited

U.S. PATENT DOCUMENTS

| | | | |
|---|---|---|---|
| 2,865,125 | 12/1958 | Langsfeld | 216/91 |
| 3,592,773 | 7/1971 | Muller | 156/637.1 |
| 3,767,494 | 10/1973 | Muraoka et al. | 156/649.1 |
| 3,914,846 | 10/1975 | Gilpin et al. | 437/250 |
| 3,964,957 | 6/1976 | Walsh | 156/345 |
| 3,977,926 | 8/1976 | Johnson, Jr. et al. | 216/91 |
| 4,251,317 | 2/1981 | Foote | 156/639.1 |
| 4,940,507 | 7/1990 | Harbarger | 156/636.1 |
| 4,946,546 | 8/1990 | Bourgeois-Moine | 216/52 |
| 5,400,548 | 3/1995 | Huber et al. | 437/249 |
| 5,494,862 | 2/1996 | Kato et al. | 156/636.1 |

FOREIGN PATENT DOCUMENTS

| | | |
|---|---|---|
| 0187307 | 7/1986 | European Pat. Off. . |
| 187307 A2 | 7/1986 | European Pat. Off. . |
| 579298A1 | 1/1994 | European Pat. Off. . |
| 60-56868 | 4/1985 | Japan . |
| 62-39173 | 2/1987 | Japan . |

OTHER PUBLICATIONS

Kaufmann et al. "Control of Etchant Temperature" IBM Tech. Discl. Bull. vol. 12 No. 10, p. 1678; Mar. 1970.

Hamaguchi "Chemical Etching of Silicon Wafer" pp. 129–134; May 1985.

*Primary Examiner*—R. Bruce Breneman
*Assistant Examiner*—Anita Alanko
*Attorney, Agent, or Firm*—A. Kate Huffman

[57] ABSTRACT

A method for pre-shaping a major surface (21,22) of a semiconductor wafer (20) in preparation for polishing includes shaping the major surface (21,22) so that it has a concave shape. In a preferred method, an etching process is used to form the concave shape. The concave shape provides a starting wafer that is extremely flat after polishing.

12 Claims, 1 Drawing Sheet

METHOD FOR PRE-SHAPING A SEMICONDUCTOR SUBSTRATE FOR POLISHING AND STRUCTURE

This application is a continuation-in-part of prior application Ser. No. 08/494,510, filed Jun. 26, 1995 now abandoned.

BACKGROUND OF THE INVENTION

This invention relates, in general, to semiconductor processing and more particularly to methods of making semiconductor substrates that are very flat.

The semiconductor industry is designing integrated circuit (IC) devices that incorporate increasingly smaller and more complex geometries. As a result, the materials and equipment used to manufacture such devices are subject to increasingly tighter constraints. For example, the semiconductor substrates or wafers used to build the IC devices must have low concentrations of defects and must be extremely flat.

Techniques for making semiconductor substrates are well known. Once an ingot of semiconductor material has been grown and shaped, it is sawn into individual substrates followed by a lapping or grinding process to make them more flat and parallel. Next, the substrate edges are rounded using an edge grind process. After edge grind, the substrates are etched to remove any work damage and contamination. Finally, the substrates are polished on one or both sides to provide a starting substrate ready for IC device manufacture.

Typically, substrate flatness is characterized by parameters such as total thickness variation (TTV) and site focal plane deviation (SFPD). The TTV of a substrate is the difference between the minimum and maximum thickness values measured across the surface of the substrate. The SFPD is the greatest distance above or below a selected focal plane and is measured either using a front side reference or a back side reference. Typically, many sites on a substrate are measured for focal plane deviation and yield is determined by the number of sites meeting a specified focal plane deviation value (e.g., less than 0.5 micron). With a back side reference SFPD (which is a more stringent test than the front side reference SFPD), the focal plane deviation is calculated based on a reference plane that is parallel to the back side of the substrate and that contains the center of the site being measured.

Although progress has been made in achieving flatter semiconductor substrates, structures and methods are still needed that produce substrates with enhanced flatness in order to support the semiconductor industry's push towards IC designs with smaller and more complex geometries. Also, it would advantageous to produce such substrates in a cost effective and reproducible manner.

DETAILED DESCRIPTION OF THE DRAWINGS

Generally, the present invention provides a method for producing a semiconductor substrate having a specific shape or surface topography in preparation for polishing. In particular, the present invention provides a substrate with one or both major surfaces having a concave shape. In other words, a pre-shaped substrate is provided that is thinner towards its center portion than at its edge portions, with the thickness getting progressively thinner from the edge portions to the center portion on at least one side of the substrate. The pre-shaped substrate results in a starting substrate with enhanced flatness after a subsequent polishing process. One can better understand the present invention by referring to FIGS. 1 to 3 together with the following detailed description.

With the semiconductor industry's push towards smaller geometry devices, some semiconductor chip manufacturers are requiring that starting substrates (i.e., substrates processed through polishing) exhibit a 100% yield to a less than 0.5 microns of SFPD using a back side reference. That is, a starting substrate must have 100% of measured sites with less than 0.5 microns in focal plane deviation. Typically, about 45 sites are measured on a 150 millimeter (mm) substrate. Prior art substrate preparation techniques cannot meet this stringent requirement in a reproducible and cost effective manner.

Figure 1:
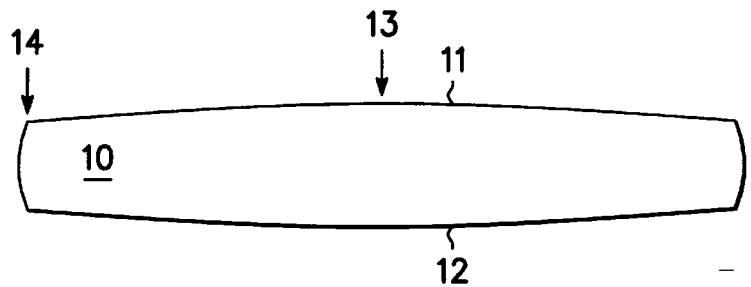
FIG. 1 illustrates an enlarged cross-sectional view of a prior art semiconductor substrate.

FIG. 1 illustrates an enlarged cross-sectional view of a typical prior art substrate after an etch process to remove work damage and contamination from preceding process steps (i.e., before polishing). Semiconductor substrate or wafer 10 includes major surfaces 11 and 12, center portion 13, and a edge portion 14. To etch substrate 10, manufacturers typically use mixtures of hydrofluoric (HF), nitric ($HNO_3$), and acetic acids. The process equipment typically includes an acid sink, which contains a tank to hold the etching solution, and one or more positions for rinsing the substrates in water. The process is batch in nature, involving many substrates. Usually, the substrates are contained within a drum or barrel apparatus, which is then rotated within the etching solution in an attempt to provide a uniform removal.

As shown in FIG. 1, substrate 10 has a convex shape. That is, center portion 13 is thicker than edge portion 14. Typically, substrate 10 is about 0.5 microns to about 3.0 microns thicker at center portion 13 than at edge portion 14. This convex shape results from prior art etching methods that etch the edge portions of the substrates faster than the center portions. That is, these methods remove more material from edge portion 14 of substrate 10 than from center portion 13.

When substrate 10 is subsequently polished, the convex shape is intensified because the dynamics of the polishing process preferentially removes material from the edge portions of a substrate faster than the center portion. As a result, after polishing, substrate 10 exhibits very poor flatness characteristics. Typically, substrate 10 has about a 40% yield to a less than 0.5 micron SFPD using a back side reference. That is, of the sites measured, only about 40% of the sites meet the less than 0.5 micron focal plane deviation requirement.

One reported prior art technique to improve flatness has focused on obtaining a substrate that is flat (i.e., a substrate with very little thickness variation) after etching to help improve flatness after polishing. However, because of the dynamics of the polishing process, an etched wafer that is more flat will still be convex after polishing.

Figure 2:
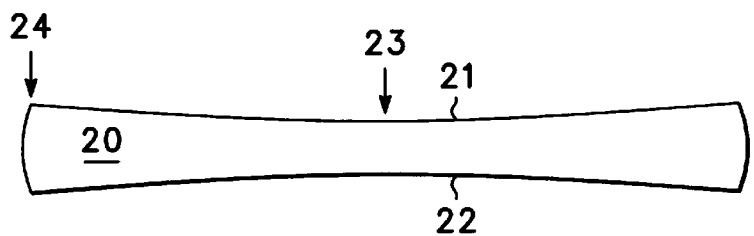
FIG. 2 illustrates an enlarged cross-sectional view of a semiconductor substrate in accordance with the present invention.

FIG. 2 illustrates an enlarged cross-sectional view of a pre-shaped semiconductor substrate or wafer 20 according to the present invention prior to polishing. Substrate 20 includes major surfaces 21 and 22, center portion 23 and edge portion 24. As shown in FIG. 2, substrate 20 has been pre-shaped such that major surfaces 21 and 22 are concave. That is, edge portion 24 is thicker than center portion 23 with the thickness of substrate 20 getting progressively thinner from edge portion 24 to center portion 23. Preferably, substrate 20 has a thickness at edge portion 24 that is about 1.0 to about 2.0 microns thicker than the thickness of substrate 20 at center portion 23. Although FIG. 2 shows both major surfaces 21 and 22 with a concave shape, in certain applications, only the major surface that is to be subsequently polished requires the concave shape.

When substrate 20 is subsequently polished, for example, using a double sided polishing process such as that disclosed in U.S. Pat. No. 5,389,579 issued to R. Wells and assigned to Motorola Inc., substrate 20 has a 100% yield to the less than 0.5 micron SFPD test using a back side reference. That is, 100% of the sites tested on substrate 20 after polishing meet the less than 0.5 micron focal plane deviation requirement. This is a significant improvement over prior art substrate 10.

Figure 3:
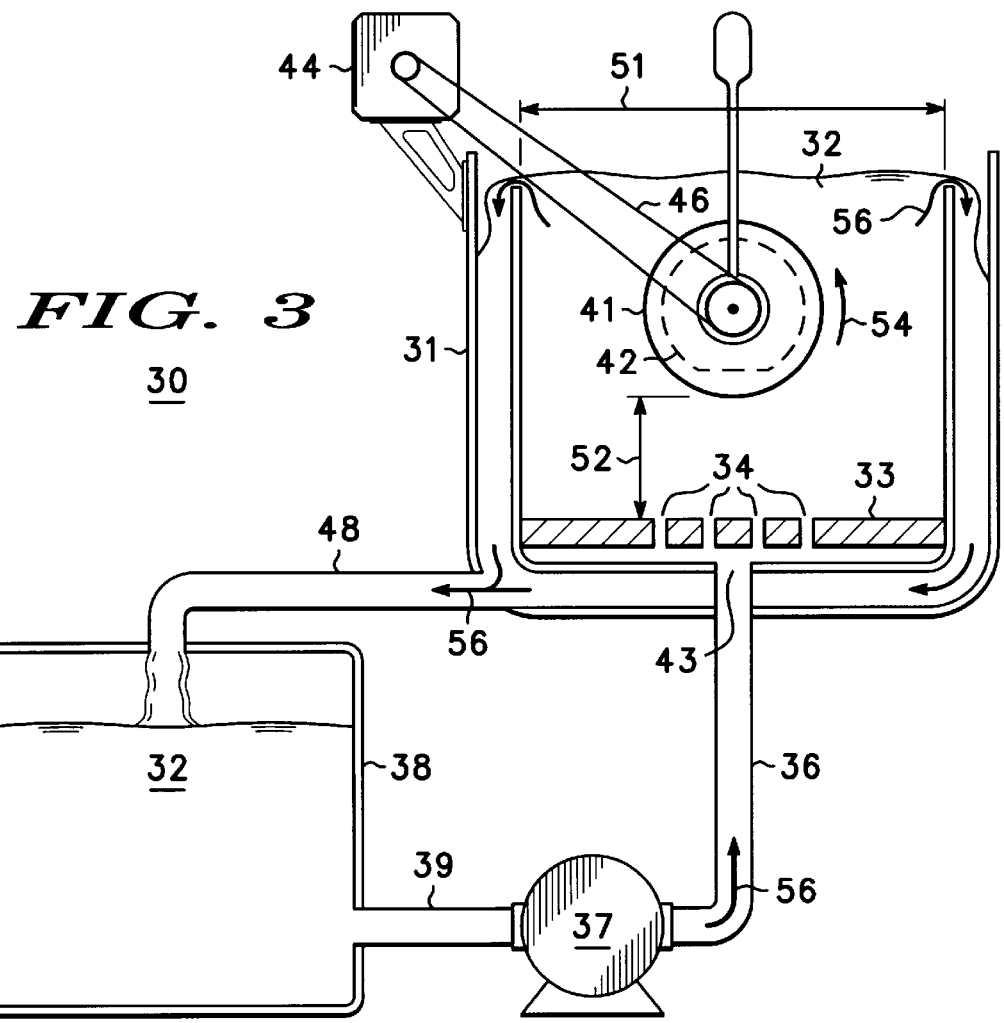
FIG. 3 illustrates a schematic of an apparatus for forming the semiconductor substrate of FIG. 2.

A preferred method for forming substrate 20 is now described. FIG. 3 illustrates a schematic illustration of an apparatus 30 for forming substrate 20. Apparatus 30 includes tank 31, which contains an etchant solution 32. Preferably, tank 31 is a double-walled (i.e., an inner wall spaced apart from an outer wall) cascade design. Typically, tank 31 has a width 51 that is about 100 mm to about 130 mm greater than the diameter of the substrates being etched.

A baffle plate 33 is located at the bottom of tank 31. Baffle plate 33 includes a series of holes 34. Typically, holes 34 have a diameter in a range from about 3.0 mm to about 7.0 mm and are spaced a distance apart in range from about 7.0 mm to about 14.0 mm. Preferably, holes 34 are concentrated below where the substrates are placed (e.g., the center of tank 31). Baffle plate 33 may have more or less holes.

An inlet line 36 runs from a pump 37 to an inlet 43 in tank 31, which is preferably centrally located at the bottom or lower surface of tank 31. Pump 37 pumps etchant solution 32 from a storage vessel 38 to tank 31. A supply line 39 runs from storage vessel 38 to pump 37. Pump 37 comprises, for example, an acid resistant pump capable of flow rates up to about 115 liters per minute (LPM). Storage vessel 38 comprises, for example, a 190 liter (about 50 gallons) capacity acid resistant vessel that is capable of maintaining etchant solution 32 at a temperature above 50° C. Such storage vessels are well known in the art.

A holder 41 containing substrates 42 (shown in phantom) is placed in etchant solution 32. Holder 41 is, for example, a drum or barrel style holder. Such holders typically comprise a pair of opposing and spaced-apart endcaps held together with several arms or bars, which extend between the opposing endcaps. Such holders are well known in the art. Preferably, holder 41 comprises a design that can hold a wafer boat or cassette, such as an low profile/minimum contact etch cassette available from Fluoroware Inc. A low profile/minimum contact etch cassette is preferred to hold substrates 42 within holder 41 because such a cassette allows etchant solution 32 to freely flow across substrates 42 and minimizes contact to substrates 42. Preferably, holder 41 is designed such that the arms or bars that extend between the opposing endcaps have a small diameter to further allow etchant 32 to freely flow across substrates 42.

A motor 44 is coupled to holder 41 by a drive means 46 for rotating holder 41 and substrates 42 within etchant solution 32 as represented by arrow 54. Motor 44 is capable of rotating holder 41 in a range from about 10 to 100 rotations per minute (rpm). Drive means 46 comprises, for example, an acid resistant belt or chain. Alternatively, holder 41 is rotated using direct drive means. Such means and devices are well known in the art.

During the etching process, etchant solution 32 is pumped from storage vessel 38 to tank 31 through inlet 43. Baffle plate 33 functions to disperse the effective force of etchant solution 32 as it enters tank 31 such that the flow of etchant solution 32 is laminar as it approaches the lower side of holder 41. In other words, baffle plate 33 reduces turbulence. Baffle plate 33 also functions to focus the flow of etchant solution 32 directly below holder 41. Etchant solution 32 flows over the top of the inner wall of tank 31 (as represented by arrows 56) and is contained by the outer wall of tank 31. Etchant solution 32 returns to storage vessel 38 through return line 48.

To provide the concave shape shown in FIG. 2, holder 41 containing substrates 42 is placed in etchant solution 32 and rotated at a speed in a range from about 5 rpm to about 50 rpm. For example, when substrates 42 comprise 125 mm or 150 mm substrates, holder 41 is rotated at about 40 rpm. Typically, holder 41 is substantially centrally placed within tank 31 such that distance 52 between the lower side of holder 41 and the top side of baffle plate 33 is equal to approximately half the diameter of substrates 42. In addition, substrates 42 are typically spaced a distance apart from each other on an order of about 6.5 mm (about 0.25 inches).

Etchant solution 32 typically comprises a mixture of $HNO_3$/HF/acetic acid and water. Preferably, etchant solution 32 comprises about 34% by weight $HNO_3$, about 8% by weight HF, about 28% by weight acetic acid and about 30% by weight water. Typically, etchant solution 32 is maintained at a temperature in range from about 55° C. to about 65° C. with a temperature of about 60° C. preferred. Pump 37 preferably pumps etchant solution 32 at a flow rate in a range from about 35 LPM to about 40 LPM. With these preferred process conditions, a center removal rate of about 75 microns per minute is obtained with a slightly lower removal rate obtained around the edges of the substrates. Preferably, etchant solution 32 is periodically replenished with a 2:5 mixture of $HNO_3$:HF.

Typically, substrates 42 have about 12 microns of damage from the preceding lapping or grinding process and an etch time in range of about 20 seconds is suitable to remove such damage and to provide a concave shape with the center portion of substrates 42 about 1.0 microns to about 2.0 microns lower than edge portions of substrates 42.

Prior to etching the substrates, it is preferred that the substrates have a TTV≦about 0.50 microns, have surface damage that is substantially uniform in depth or thickness (i.e., minimal localized damage), and have a substrate thickness that is symmetric about the center of the substrate as opposed to having side to side taper. In addition, it is preferred that any substrate to substrate thickness variation not exceed plus or minus about 6.0 microns to about 7.0 microns.

The above method for pre-shaping a semiconductor wafer is preferred because it allows a manufacturer to process several wafers at the same time. This in turn saves time and material costs. When only one major surface is pre-shaped, a thick protective layer is used to protect the other major surface. Such protective layers and techniques for forming them are well known in the art.

IC manufacturers typically require that the unpolished side of a starting substrate have minimal staining (i.e., minimal localized differences in topography on the order of a few angstroms), have a surface roughness of about 1,000 angstroms to about 4,000 angstroms, and have a reflectivity of about 35% to about 50%. Surface roughness represents the average height difference between high points and low points and the average width of the high points and low points (commonly referred to as $R_a$) on the unpolished surface as measured by a surface profilometer.

After the preferred pre-shaping method described above, some staining typically occurs. Also, a surface roughness greater than the desired 4,000 angstroms and a reflectivity less than about 20% typically occurs. As a result, in order to meet the above requirements, it is preferred that the major surface of substrate 20 that subsequently will not be polished during primary polish, be processed or conditioned to reduce any staining, to reduce excessive surface roughness, and to increase reflectivity. For the following discussion, major surface 21 will be the major surface that will be conditioned. It is understood that major surface 22 could be conditioned in addition to in alternatively to major surface 21.

Preferably, major surface 21 is conditioned by briefly polishing it using a single sided polisher with a soft pad to remove about 1,000 angstroms to about 2,000 angstroms of material. An example of a suitable single sided polisher is a Strausbaugh 6DS polisher available from Strausbaugh of San Luis Obispo, Calif. A low removal or soft polishing pad such as a Politex Supreme low nap or no nap polishing pad is suitable. Such pads are available from Rodel of Scottsdale, Arizona. Preferably, a fine particle slurry such as a TIZOX 1300 (available from Transelco of Pennyan, N.Y.) diluted to a 10:1 (de-ionized water/slurry) dilution by volume is used.

Prior to conditioning major surface 21, substrate 20 preferably is cleaned in a diluted HF solution to remove any native oxide from substrate 20. Substrate 20 is then placed on the single sided polisher and major surface 21 is briefly exposed to the polishing pad and slurry to remove any stains, reduce excessive surface roughness, and to increase reflectivity. Preferably, substrate 20 is polished for about 2 to 3 minutes with an applied pressure of about 2,100 kilograms per square meter of semiconductor material (about 3 pounds per square inch of semiconductor material). Preferably, a head speed of about 60 rpm and a table speed of about 60 rpm are used.

Preferably, before substrate 20 is touch polished, the polishing pad is conditioned by thoroughly applying slurry to the pad to charge it and to prepare it. A nylon brush is suitable for applying the slurry. After the touch polish process, substrate 20 is cleaned using conventional techniques to remove any contaminates. This post-etch surface conditioning process according to the present invention provides a reduced amount of staining, provides a surface roughness of about 1,000 angstroms to about 4,000 angstroms, and provides a reflectivity of about 35% to about 50% in a consistent and reproducible manner.

By now it should be appreciated that there has been provided a substrate having a concave or bowl-like shape and a method for forming it. The concave shape is formed prior to polishing the substrate. Once the substrate is polished, a starting substrate is provided that has an enhanced flatness compared to prior art starting substrates. Also, a post etch surface conditioning process has been provided that reduces staining, that results in a surface roughness in range from about 1,000 angstroms to about 4,000 angstroms, and that results in a reflectivity of about 35% to about 50%.

We claim:

1. A method for shaping a semiconductor substrate comprising the steps of:

placing a semiconductor substrate having a first major surface and a second major surface opposed from the first major surface into a tank containing an acid etchant;

chemically shaping the semiconductor substrate with the acid etchant so that one of the first major surface and the second major surface has a concave shape; and conditioning one of the first major surface and the second major surface to reduce any staining and to provide a reflectivity in a range from about 35% to about 50%.

2. The method of claim 1 wherein the step of chemically shaping the semiconductor substrate includes chemically shaping the semiconductor substrate such that both major surfaces have a concave shape.

3. The method of claim 1 wherein the step of placing the semiconductor substrate includes placing the semiconductor substrate into the tank, wherein the acid etchant comprises about 34% by weight $HNO_3$, about 8% by weight HF, about 28% by weight acetic acid, and about 30% by weight water.

4. The method of claim 3 wherein the step of chemically shaping the semiconductor substrate includes chemically shaping the semiconductor substrate in an acid etchant solution maintained at a temperature from about 55° C. to about 65° C.

5. The method of claim 3 wherein the step of chemically shaping the semiconductor substrate includes rotating the semiconductor substrate in the acid etchant at a rate from about 5 rpm to about 50 rpm.

6. A method for pre-shaping a substrate in preparation for subsequent polishing comprising the steps of:

providing a substrate having an edge portion and a center portion;

chemically shaping the substrate such that the edge portion is thicker than the center portion, wherein the substrate has a thickness that gets progressively thinner from the edge portion to the center portion, and wherein the chemically shaping step is done absent mechanical polishing; and thereafter conditioning one surface of the substrate to increase the reflectivity of the one surface, wherein the one surface is a major surface that will not be subjected to a subsequent primary polish process.

7. The method of claim 1 further comprising the step of removing any native oxide before the step of conditioning.

8. The method of claim 6 wherein the step of conditioning includes briefly polishing the one surface to provide a reflectivity in a range from about 35% to about 50%.

9. The method of claim 6 wherein the step of conditioning provides a surface roughness from about 1,000 angstroms to about 4,000 angstroms.

10. The method of claim 1 wherein the step of conditioning includes briefly polishing one of the first major surface and the second major surface.

11. The method of claim 10 wherein the step of briefly polishing removes about 1,000 angstroms to about 2,000 angstroms of material.

12. The method of claim 6 further comprising the step of removing any native oxide before the step of conditioning.

* * * * *